US005546002A

United States Patent [19]

Hickl

[11] Patent Number: 5,546,002

[45] Date of Patent: Aug. 13, 1996

[54] CIRCUIT FOR TESTING TWO SWITCH OR RELAY CONTACTS SIMULTANEOUSLY IN AUTOMATIC CONTROL SYSTEMS

[75] Inventor: Erich Hickl, Malsch, Germany

[73] Assignee: Landis & Gyr Business Support AG, Zug, Switzerland

[21] Appl. No.: 154,295

[22] Filed: Nov. 18, 1993

[30] Foreign Application Priority Data

May 8, 1993 [CH] Switzerland ............................. 695/93

[51] Int. Cl.[6] ......................... G01R 31/02; G01R 31/327

[52] U.S. Cl. .......................... 324/418; 324/415; 340/644

[58] Field of Search .................................... 324/415, 418, 324/419, 537; 361/160, 170, 187; 340/644

[56] References Cited

U.S. PATENT DOCUMENTS 3,452,271 6/1969 Ketter ..................................... 324/415
3,575,607 4/1971 Edstrom et al. ........................ 324/418
3,699,300 10/1972 Buerki ................................ 219/10.55

FOREIGN PATENT DOCUMENTS 1473021 5/1977 United Kingdom .

*Primary Examiner*—Walter E. Snow
*Attorney, Agent, or Firm*—Meltzer, Lippe, Goldstein, et al.

[57] ABSTRACT

In order to provide a dependable check on the reliable functioning of contacts of switches or relays which control a control device, to ascertain whether they occupy the desired rest contact position and/or have a sufficiently high mains voltage, the rest contacts of the two switches can be connected in parallel by way of a respective electrical resistor to a pole of the voltage source and both resistors can be connected in series to a charging capacitor which, upon the attainment of a given electrical charge or voltage (threshold voltage) activates the control device and in particular feeds a threshold switch or itself serves as such.

7 Claims, 3 Drawing Sheets

GP Gas pressure monitor

R Regulator

SBV Safety fuel valve

HSI Incandescence igniter

BV1 Fuel valve 1

BV2 Fuel valve 2

FS Flame signal

AL Alarm

FSV Flame signal amplifier

BR Blocking relay

USP Undervoltage detection circuit $t_W$ Test time (waiting time)

$t_{PH}$ Preheating time $t_{IGN}$ Ignition time $t_H$ Heating time $t_S$ Safety time $t_I$ Interval time I HSI as sensor electrode (start-up with flame formation in ts)
II separate sensor electrode (start-up with flame formation in ts)
III no flame formation in ts
IV flame break-down in operation (separate sensor electrode)

CIRCUIT FOR TESTING TWO SWITCH OR RELAY CONTACTS SIMULTANEOUSLY IN AUTOMATIC CONTROL SYSTEMS

BACKGROUND OF THE INVENTION

1. Field of the Invention

The invention relates to circuit arrangements for testing switch or relay contacts and use for automatic firing arrangements.

2. Description of the Prior Art

Control or regulating units are employed in the control or regulating art for controlling or regulating processes. In order to switch such control or regulating units on or off, it is known to use switches or relays whose switching contacts or movable switching elements respectively assume in the rest condition a given position in which the so-called "rest contact" is contacted while in another switch condition they can be lifted off the rest contact and can be applied to another contact. For reasons related to safety procedure, it is important for reliable operation of the control device or the mode of operation controlled or in particular regulated thereby that testing of the contacts of the switches or relays is effected in order to ensure that the process is stopped or cannot in any way initially start in the event of a malfunction, in particular if in the rest condition it is not the rest contact but another contact of the switch that is contacted.

SUMMARY OF THE INVENTION

The object of the present invention is to make it possible to carry out such a testing operation which is required in particular for reasons relating to safety procedure, in respect of proper operability of two contacts of such switches or relays, using simple means.

The invention provides a circuit arrangement for testing two switches or relays, each having a switching element, said switching elements of said two switches or relays being interconnected, each of said two switches or relays having a respective rest contact, said circuit arrangement comprising:

(I) two electrical resistors, each connected between said rest contact of a respective one of said switches or relays and an electrical supply terminal, said electrical supply terminal being connectable to a voltage source;

(II) a charging capacitor connected to said rest contact of one of said switches or relays, whereby, when said two switches or relays are switched to said respective rest contacts, said charging capacitor is connected to receive charging current From said electrical supply terminal via a parallel circuit of said two electrical resistors; and (III) a control device For controlling switching of said switches or relays in dependence on whether either an electrical charge held by said charging capacitor is at least a predetermined electrical charge or an electrical voltage across said charging capacitor is at least a predetermined electrical voltage.

In accordance with the invention on the one hand a parallel circuit is made between the rest contacts of the two switches in relation to the voltage source or a pole thereof by way of a respective resistor. On the other hand, the two resistors are connected to a charging capacitor or generally a threshold switch which activates the control device upon the attainment of a given electrical charge or a threshold voltage respectively. In the switched-off, that is to say rest condition of the two switches, when the movable switching element respectively bears against the associated rest contact, the pole of the voltage source is applied to the charging capacitor by way of a respective resistor. The charging capacitor is charged up by way of the two resistors which in this case are connected in parallel to the pole of the voltage source, and in particular a series-connected coupling resistor and rectifier, so that, with a sufficient mains voltage, after a given time it attains the threshold voltage and actuates the control device, for example starts a given program procedure, possibly by way of an additional threshold switch. If in contrast the rest contact condition of one of the two contacts is interrupted and/or if the voltage is below a minimum voltage value, then the charging capacitor is not sufficiently charged up, the threshold voltage is not reached and the control device cannot be correspondingly initiated whereby the program procedure is also not started. That therefore provides For reliable contact monitoring of the switching contacts in the current path, for example, of fuel valves of burners. The safety Function is performed in that, in the event of a malfunction of one of the switches (referred to as SKa, SKc), that malfunction is detected with the reaction that the other switch is not activated. Thus, the fuel valve is not incorrectly actuated in a defect situation.

Simultaneously with contact monitoring in respect of the switches SKa and SKc however, it is also possible to detect the mains voltage so that the arrangement is not set in operation in the event of an undervoltage if the charging capacitor is not charged up to a given switching threshold.

It is preferred that the two resistors should not be selected to be of the same size, but that different ohmic values are to be associated therewith, more specifically in such a way that the series circuit of the coupling resistor with the resistor connected to one pole, for example the N-pole is high-ohmic relative to the series circuit of the same coupling resistor with the parallel circuit of said resistor and the other resistor which is connected by way of the rest contacts of the two switches to the pole, for example the N-pole. That provides for the Following: the charging capacitor is charged up with the current which comes from the series circuit of the coupling resistor with said parallel circuit of the two resistors (and a rectifier and a capacitor); in that situation the charging voltage corresponds to the mains voltage between the mains poles, for example N and L.

Furthermore, it is also possible to use an additional protective circuit which detects simultaneous failure of both contacts and then blocks the control device and/or triggers off a display device, for example an alarm unit.

In accordance with a particular configuration of the invention this use occurs in an automatic Firing arrangement for, for example, gas burners. In that situation, one of the two switches or relays is associated with the fuel valve and the other switch or relay is associated with the supply voltage, thereby to ensure that it is only when there is a given gas pressure at the fuel valve that the control device comes into operation.

BRIEF DESCRIPTION OF THE DRAWINGS

The above, and other objects, features and advantages of this invention will be apparent from the following detailed description of illustrative embodiments which is to be read in connection with the accompanying drawings, in which.

DESCRIPTION OF THE PREFERRED EMBODIMENTS

Figure 1:
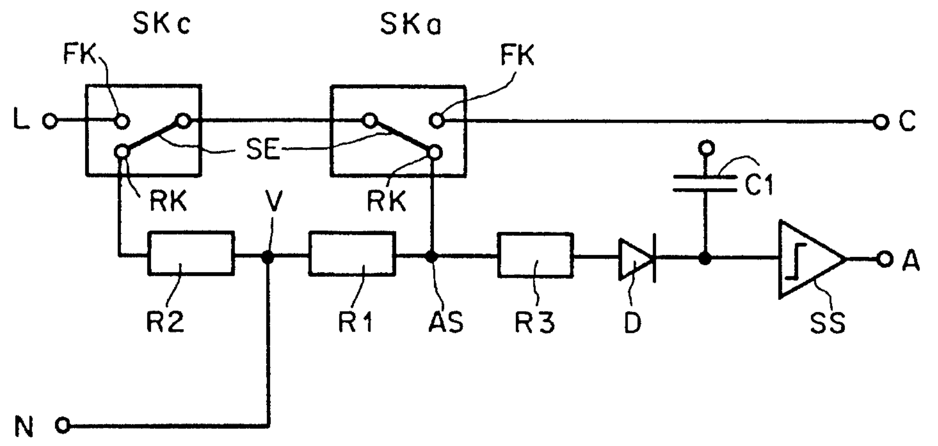
FIG. 1 is a schematic circuit diagram showing the principle of an embodiment of the invention.

As shown in FIG. 1, the switching contacts SKa, SKc of two switches or relays A, C are electrically connected together in such a way that the one ends of the movable switching element SE are connected together while the rest contacts RK to which the movable switching elements SE are applied in the switched-off, that is to say rest, condition are connected together by way of two series-connected resistors R1, R2. The connecting location V of the two resistors R1, R2 is connected to a pole N of a voltage source while the contact FK of the switch SKa, which is free in that condition, is connected to the other pole L of the voltage source. The free contact FK of the other switch SKc is connected to the relay C, for example of a fuel valve, in order to apply voltage to same when both switching elements SE of the two switches SKa and SKc are not applied against the rest contact RK but the free contacts FK in the switched-on operational position. The connecting location AS between the rest contact RK of the switch SKc and the resistor R2 is connected to a coupling resistor R3 and the latter is connected to a rectifier D which is in the form of a diode so that the charging capacitor C1 can be charged up when a voltage occurs. A threshold switch SS responds in dependence upon the voltage which then occurs, in order to initiate the relay A when a predetermined threshold voltage is attained. When the two switching elements SE of both switches SKa, SKc are in the rest condition, as described, at the rest contacts RK, then a current which is dependent on mains voltage flows on the one hand directly by way of the resistor R2 and on the other hand by way of the resistor R1 and the two switching elements SE, and results in charging of the charging capacitor C1. If one of the two switching elements SE has not assumed the rest condition at the rest contact RK due to a defect, then the resistor R2 for the operation of charging up the charging capacitor C1 is out of operation so that, with appropriate dimensioning of the components involved, a sufficient threshold voltage does not occur for initiating the control device or the relay A. The same result, namely the non-attainment of the threshold voltage, occurs when a sufficiently high voltage is not attained at the pole N of the voltage source. In that respect, the circuit arrangement is also suitable as a protective circuit in relation to excessively low voltages of the voltage source.

Figure 2:
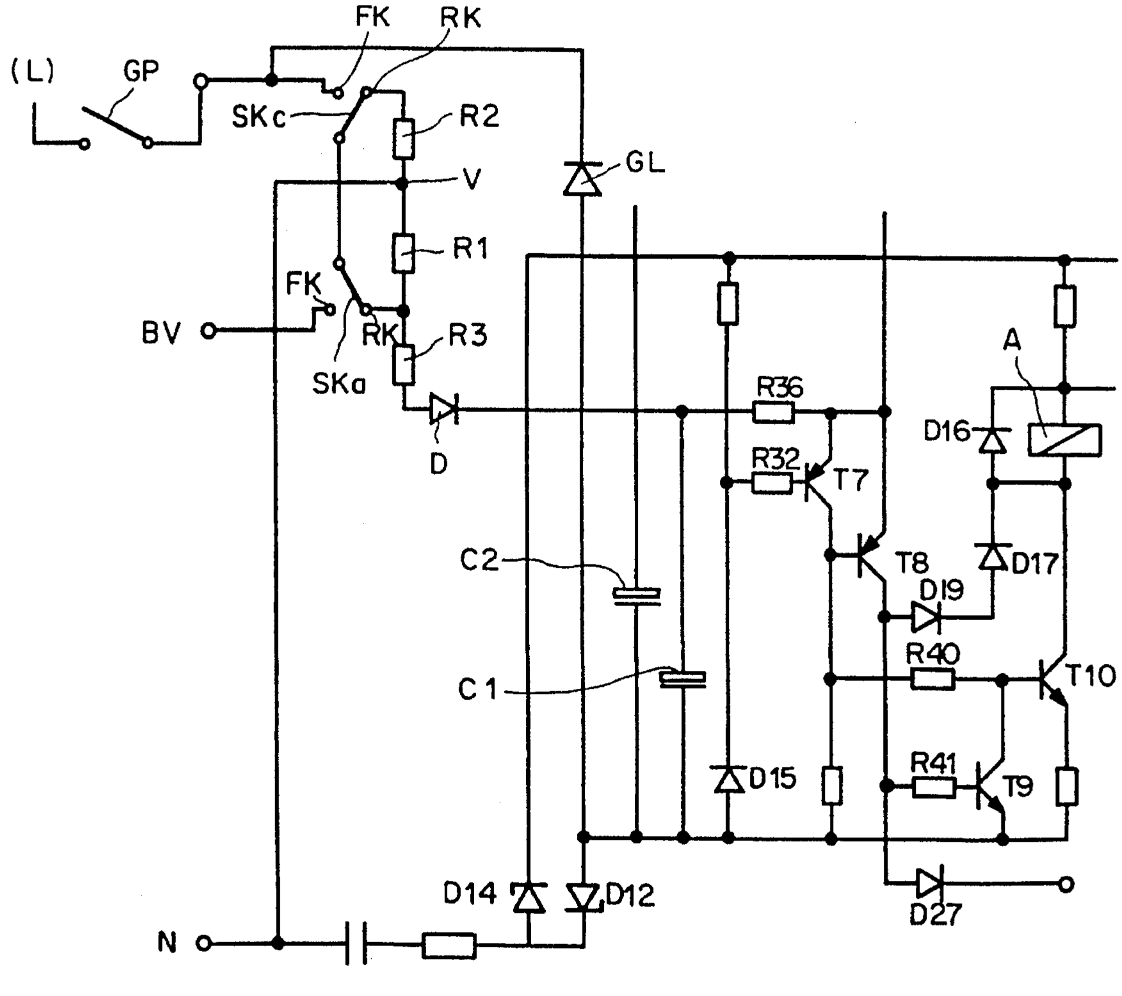
FIG. 2 shows a preferred circuit arrangement when specially equipped with transistors.

In the embodiment shown in FIG. 2, the switching contact SKc is connected with its free contact FK to a gas pressure monitor GP while the free contact FK of the other switch SKa is connected to the fuel valve BV. The series circuit of the parallel-connected resistors R2, R1 with the coupling resistor R3 and the rectifier D is connected to the charging capacitor C1 whose other terminal is connected to the gas pressure monitor GP by way of a rectifier diode GL, thereby giving the charging current branch to the other pole L. When the charging capacitor C1 reaches a given threshold voltage, which is the situation when the switches SKa, SKc are in the correct rest condition, then the transistor T7 also reaches the threshold of for example 8 V, whereby the transistor T10 actuates the relay A and thereby the transistors T7 and T10 act as a control device, that is to say the program procedure is started. The capacitor C2 serves for smoothing the supply voltage.

If the rest contact condition of one of the switches SKa, SKc is interrupted and/or if the voltage is below a predetermined mains voltage range, then the switching threshold of the transistor T7 is not reached and the program procedure cannot be started.

The particularly preferred example of use will now be described with reference to FIG. 3 which also gives the brief identifications of the individual units.

Figure 3:
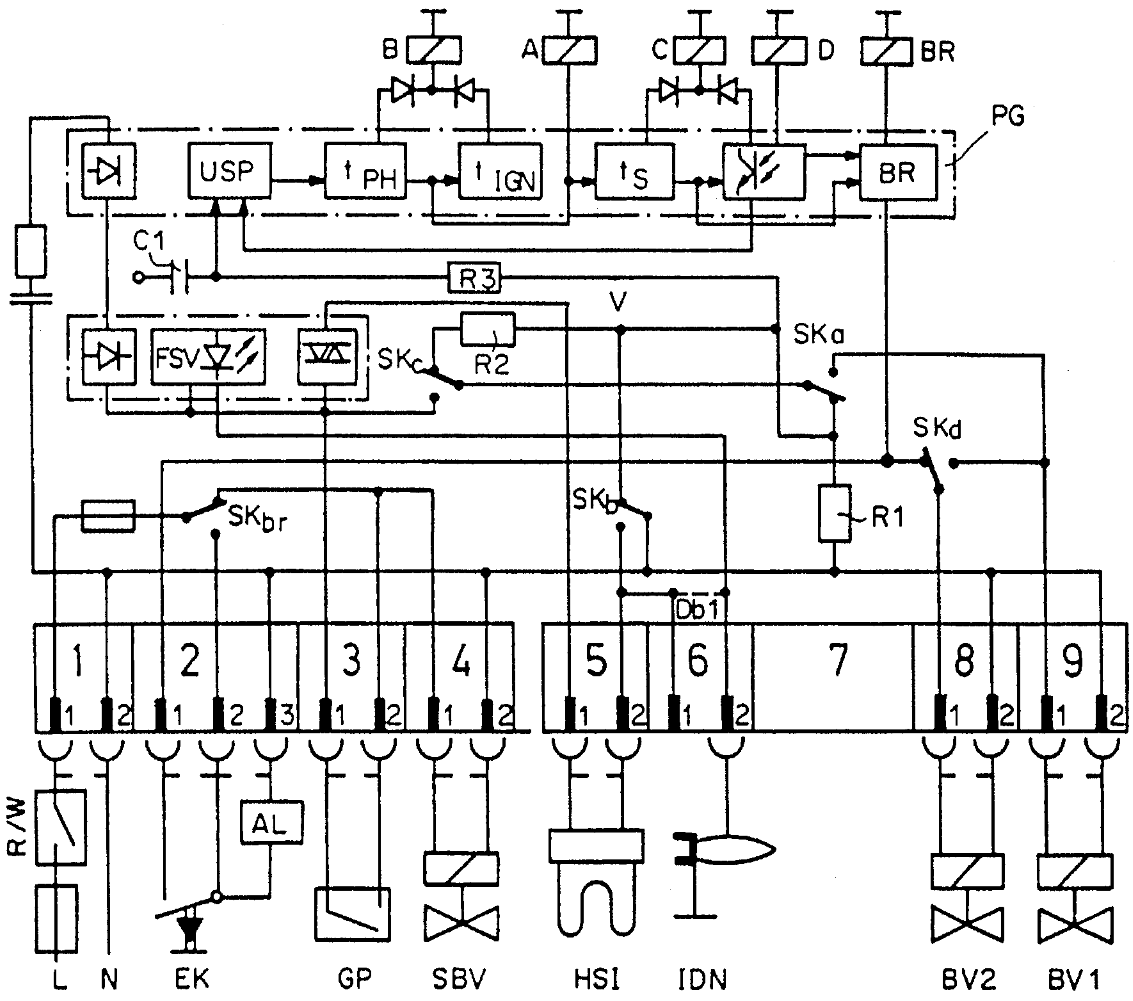
FIG. 3 is a diagrammatic view of the invention when used in an automatic firing arrangement for gas burners.
Figure 4A:
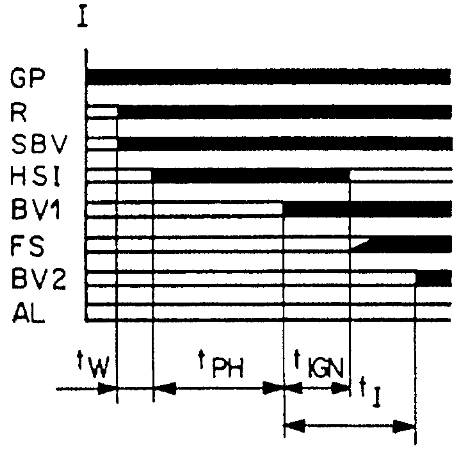
FIGS. 4A–4D shows four functional diagrams I, II, III and IV for individual units of the automatic firing arrangement in dependence on time.
Figure 4B:
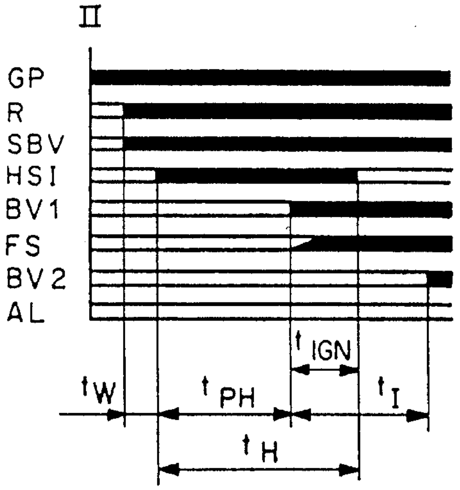
Figure 4C:
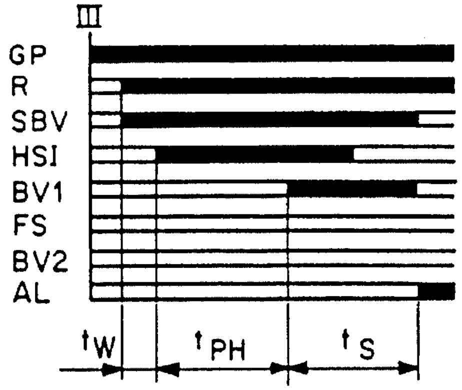
Figure 4D:
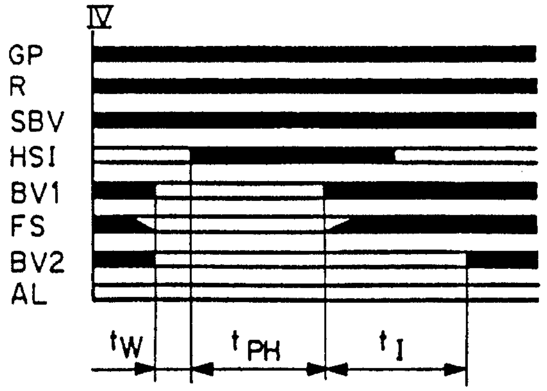

The automatic firing arrangement which is diagrammatically shown in FIG. 3 in regard to its connections and structural groups, for atmospheric gas burners of low output of up to about 70 kVA is connected by way of the terminals 1–6 and 8–9 to the following units:

1 by way of the switch R/W to the ac voltage mains with the poles L, N of an ac voltage of 230 V

2 to the fault-clearance button EK with the interposition of an alarm device AL

3 to the gas pressure monitor GP

4 to the safety fuel valve SBV

5 to the incandescence igniter HSI which in its preferred configuration is admittedly designed for 120 V ac voltage but which can be operated with the mains voltage of 230 V as due to pulse width modulation it is not supplied with all parts of the ac voltage waves

6 the sensor electrode of the flame sensor IDN

7 provided for further elements as options

8 the fuel valve 2 BV2 and

9the fuel valve 1 BV1, as this is a two-stage burner.

The programmer PC controls the relay B for the incandescence igniter HSI, the relays A and C for the Fuel valve BV1 and the relay D for the further fuel valve BV2 and the relay BR for the overall circuit in the fault situation.

In a corresponding fashion, various control stages are diagrammatically represented in the programmer PC, as follows:

USP: undervoltage detection circuit $t_{PH}$: preheating time $t_{IGN}$: ignition time $t_S$: safety time BR: blocking relay Connected between the gas pressure monitor GP and the incandescence igniter HSI is a TRIAC-switching stage and a flame signal amplifier FSV which evaluates the signal From the flame sensor IDN and which in turn outputs an output signal to the programmer PC.

This circuit arrangement links the terminals to the programmer PG in the manner shown in the circuit diagram. In that arrangement, the switch SKa of the relay A and the switch SKc of the relay C are connected together in respect of their movable switching elements. In addition, the rest contacts are connected together by way of the two resistors R1, R2, the connecting location V of which is connected to the rest contact of the switch SKb of the relay B whose other contact is connected to the incandescence igniter HSI in order to apply voltage to same upon initiation of the relay B. As the movable switching element of the switch SKb is connected to the pole N of the voltage source, in the rest condition of the switch SKb the connecting location V is connected to the same pole N so that the voltage goes by way of the resistor R3 to the charging capacitor C1 and the programmer PG is controllable by way of the undervoltage detection circuit USP for the contact test, in dependence on a predetermined threshold voltage being exceeded.

The curves diagrammatically shown in thick solid lines in FIGS. 4A–4D show the start-up of the respective units, whereafter in all three functional diagrams the gas pressure monitor GP testifies to adequate gas pressure in the gas feed to the burner and the regulator R initiates program start in the functional diagrams I, II and III. The safety valve SBV is in operation in each case while the regulator R is operating. The incandescence igniter HSI is initiated by a time delay (during that test time $t_w$ contact testing takes place, that is to say, the charging capacitor C1 is charged up), after the commencement of regulation R. Beginning from that time of activation of the igniter HSI, the preheating time $t_{PH}$ takes place, until the commencement of opening of the first gas or, in general terms, fuel valve BV1, whereupon the ignition time $t_{IGN}$ begins in the functional diagrams I and II so that the igniter HSI is activated throughout the entire heating time $t_H$. The interval $t_I$ is that period of time between the switching on of the first fuel valve BV1 and the switching on of the second fuel valve BV2. An alarm is triggered in accordance with functional diagram III if the flame sensor does not detect the Formation of a Flame, during the safety time $t_S$, and that results in the arrangement being switched off, while the functional diagrams I and II represent the start-up of the automatic firing arrangement with the formation of a flame during the safety time $t_S$. The functional diagram IV schematically represents the conditions involved in the event of a flame break-down during regulator operation; if, in the subsequent restart, a flame is again formed within the safety time $t_S$, then the operative condition is also attained again. The circuit arrangement according to the invention ensures that operational reliability of the relays A, C with their switches SKa, SKc is fully functional.

Therefore, the invention not only permits attainment of the above-indicated object but, in the form of a particular configuration, it also permits the detection of inadequate voltage with the result that, with an excessively low voltage, that is to say in the event of a "undervoltage", steps relating to a safety procedure are taken and for example operation is switched off or is not switched on at all initially.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A circuit arrangement for testing simultaneously two switches or relays, each having a switching element, said switching elements of said two switches or relays being interconnected, each of said two switches or relays having a respective rest contact, said circuit arrangement comprising:

(I) two electrical resistors, each connected between said rest contact of a respective one of said switches or relays and an electrical supply terminal, said electrical supply terminal being connectable to a voltage source;

(II) a charging capacitor connected to said rest contact of one of said switches or relays, whereby, when said two switches or relays are switched to said respective rest contacts, said charging capacitor is connected to receive charging current from said electrical supply terminal via a parallel circuit of said two electrical resistors; and (III) a control device for controlling switching of said switches or relays in dependence on whether either an electrical charge held by said charging capacitor is at least a predetermined electrical charge or an electrical voltage across said charging capacitor is at least a predetermined electrical voltage after a predetermined time so that said two switches or relays are tested simultaneously.

2. A circuit arrangement according to claim 1, comprising a threshold switch connected between said charging capacitor and said control device.

3. A circuit arrangement according to claim 1, comprising a coupling resistor and a rectifier connected between said rest contact of said one of said switches or relays and said charging capacitor.

4. A circuit arrangement according to claim 1, in which: said two electrical resistors have different ohmic values; and a series circuit of one of said resistors with a coupling resistor is of high resistance relative to a series circuit of said coupling resistor with a parallel circuit of said two electrical resistors.

5. A circuit arrangement for testing two switches or relays, each having a switching element, said switching elements of said two switches or relays being interconnected, each of said two switches or relays having a respective rest contact, said circuit arrangement comprising:

(I) two electrical resistors, each connected between said rest contact of a respective one of said switches or relays and an electrical supply terminal, said electrical supply terminal being connectable to a voltage source;

(II) a charging capacitor connected to said rest contact of one of said switches or relays, whereby, when said two switches or relays are switched to said respective rest contacts, said charging capacitor is connected to receive charging current from said electrical supply terminal via a parallel circuit of said two electrical resistors;

(III) a control device for controlling switching of said switches or relays in dependence on whether either an electrical charge held by said charging capacitor is at least a predetermined electrical charge or an electrical voltage across said charging capacitor is at least a predetermined electrical voltage; and (IV) a protective circuit operable to detect a failure of one of said two switching elements of said switches or relays and to block the control device in response to a detection of a failure of one of said two switching elements of said switches or relays.

6. A circuit arrangement for testing two switches or relays, each having a switching element, said switching elements of said two switches or relays being interconnected, each of said two switches or relays having a respective rest contact, said circuit arrangement comprising:

(I) two electrical resistors, each connected between said rest contact of a respective one of said switches or relays and an electrical supply terminal, said electrical supply terminal being connectable to a voltage source;

(II) a charging capacitor connected to said rest contact of one of said switches or relays, whereby, when said two switches or relays are switched to said respective rest contacts, said charging capacitor is connected to receive charging current from said electrical supply terminal via a parallel circuit of said two electrical resistors;

(III) a control device for controlling switching of said switches or relays in dependence on whether either an electrical charge held by said charging capacitor is at least a predetermined electrical charge or an electrical voltage across said charging capacitor is at least a predetermined electrical voltage; and (IV) an undervoltage detection circuit operable to detect inadequate charging of said charging capacitor or inadequate voltage of said voltage source, and to prevent the control device from coming into operation in response to a detection of inadequate charging of said charging capacitor or inadequate voltage of said voltage source.

7. An automatic firing arrangement comprising a circuit arrangement according to any one of the preceding claims, in which:

(I) one of said switches or relays is connected to a pressure monitor; and (II) the other of said switches or relays is connected to a fuel valve.

* * * * *